(12) United States Patent
Yoshiyama et al.

(10) Patent No.: US 6,479,873 B1
(45) Date of Patent: Nov. 12, 2002

(54) SEMICONDUCTOR DEVICE WITH SELF-ALIGNED CONTACT STRUCTURE

(75) Inventors: Kenji Yoshiyama, Hyogo (JP); Keiichi Higashitani, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/444,848

(22) Filed: Nov. 22, 1999

(30) Foreign Application Priority Data

Jun. 10, 1999 (JP) .......................................... 11-163929

(51) Int. Cl.$^7$ .................... H01L 29/76; H01L 29/94; H01L 31/062; H01L 31/113; H01L 31/119
(52) U.S. Cl. .................... 257/382; 257/383; 257/412
(58) Field of Search ........................ 257/382, 383, 257/384, 412, 413, 377; 438/233, 682, 672

(56) References Cited

U.S. PATENT DOCUMENTS

| | | | | |
|---|---|---|---|---|
| 5,677,227 A | * | 10/1997 | Yang et al. | 438/253 |
| 5,721,154 A | * | 2/1998 | Jeng | 438/253 |
| 5,792,689 A | * | 8/1998 | Yang et al. | 438/253 |
| 6,008,085 A | * | 12/1999 | Sung et al. | 438/253 |
| 6,110,818 A | * | 8/2000 | Haskell | 438/621 |
| 6,174,803 B1 | * | 1/2001 | Harvey | 438/638 |

FOREIGN PATENT DOCUMENTS

| | | |
|---|---|---|
| JP | 8-250603 | 9/1996 |
| JP | 9-326440 | 12/1997 |

* cited by examiner

*Primary Examiner*—Olik Chaudhuri
*Assistant Examiner*—Hoai Pham
(74) *Attorney, Agent, or Firm*—McDermott, Will & Emery

(57) ABSTRACT

A semiconductor device more reduced in size and a manufacturing method thereof are provided. A gate electrode is covered with a silicon nitride film having a selecting ratio greater than an NSG film under a prescribed etching condition. A cobalt suicide film is formed on an upper surface of source/drain regions. Furthermore, a refractory metal silicide film forming the gate electrode is formed by a cobalt silicide film.

9 Claims, 15 Drawing Sheets

SEMICONDUCTOR DEVICE WITH SELF-ALIGNED CONTACT STRUCTURE

BACKGROUND OF THE INVENTION

1. Field of the Invention

The present invention relates to a semiconductor device having a self-aligned contact structure and a manufacturing method thereof.

2. Description of the Background Art

A Self-Aligned Contact (hereinafter simply as "SAC") in which a contact hole connecting to a source/drain region in a self-aligned manner to a film protecting gate electrode has been used. Since this conventional structure allows a contact hole reaching a source/drain region to be formed without considering the position of a gate electrode, and the structure is therefore essential in reducing the size of the transistor thereby reducing a semiconductor device. The structure has been therefore often employed for conventional DRAMs (Dynamic Random Access Memories). The SAC structure applied for these devices have a refractory metal silicide film on the gate electrode but not on source/drain regions.

In recent years, in order to further improve the performance of the semiconductor devices, efforts have been made to reduce the contact resistance between source/drain regions and contact interconnections. Therefore, a contact structure having a refractory metal silicide film both on the surfaces of source/drain regions and a gate electrode came to be a mainstream, particularly in logic-based devices.

In conventional salicide process where the entire surface of a silicon substrate is covered with a refractory film, followed by a heat treatment to cause the silicon to react with the refractory metal, so that the refractory metal silicide film is formed both on the surfaces of the source/drain regions and the gate electrode at a time, a protection film to cover the gate electrode cannot be formed. Therefore, a contact hole to connect to the source/drain region cannot be formed with the protection film covering the gate electrode. This is because a method of manufacturing a semiconductor device according to the conventional salicide process is as follows. A conventional method of manufacturing a semiconductor device where the upper surface of a gate electrode and the upper surface of source/drain regions are formed into silicide at a time will be now described in conjunction with FIGS. 25 to 40.

An isolation oxide film 102 to isolate an element forming region is formed on a p-type silicon substrate 101. A silicon oxide film 104 as thick as 3 nm for example to be a gate insulating film is formed in the element isolation region. Then, a polycrystalline silicon film 103 as thick as 200 nm is formed on silicon oxide film 104 and the state as shown in FIG. 25 is attained. As shown in FIG. 26, resist film 108 is patterned on polycrystalline silicon film 103. Using resist film 108 as a mask, etching is performed until a surface of silicon oxide film 104 to be a gate oxide film is exposed, followed by removal of resist film 108, and polycrystalline silicon film 103 forming a gate electrode as shown in FIG. 27 is attained.

Using polycrystalline silicon film 103 as a mask, an impurity to form a source/drain region 110 is implanted, and then a sidewall insulating film such as a sidewall silicon nitride film 109 is formed. Then, an impurity to form a source/drain region 111 is implanted to form an LDD (Lightly Doped Drain), and the state as shown in FIG. 28 is attained.

Then, a heat treatment is performed with a refractory metal film covering the entire surface of silicon substrate 101 to form a refractory metal silicide film 106 on the upper surface of polycrystalline silicon film 103 and on the upper surface of source/drain 111, a gate electrode 136 is formed, followed by removal of a non-reacted part of refractory metal film, and the state as shown in FIG. 29 is attained.

An NSG (Non Doped Silicate Glass) film 114 is formed to cover the entire surface of silicon substrate 101. Then, a silicon nitride film 115 is formed on NSG film 114. A BPSG (Boro-Phospho Silicate Glass) film 116 is formed on silicon nitride film 115. Then, the surface of BPSG film 116 is subjected to CMP (Chemical Mechanical Polishing) and flattened, and the state as shown in FIG. 30 is attained.

After forming a pattern of a resist film on source/drain regions 110 and 111 to form contact holes 131 and 132, etching is performed until a surface of silicon nitride film 115 is exposed. Then, contact holes 131 and 132 are further deepened so as to sequentially etch silicon nitride film 115 and NSG film 114, etching is performed until a surface of refractory metal silicide film 106 is exposed, and the state as shown in FIG. 31 is attained. Contact plugs 131a and 132a are formed to fill contact holes 131 and 132, and the state as shown in FIG. 32 is attained.

In a semiconductor device having a conventional SAC structure manufactured according to the manufacturing method described above, as shown in FIG. 31, a film to serve as a protection film cannot be formed on gate electrode 136 when contact hole 131 is formed. If therefore the position to form contact hole 131 reaching refractory metal film 106 on source/drain regions 110 and 111 is shifted to the side of gate electrode 136, not only a surface of refractory metal silicide film 106 on source/drain regions 110 and 111, but also a surface of refractory metal silicide film 106 on gate electrode 136 is exposed. Thus, as shown in FIG. 32, when contact plug 131a is filled in contact hole 131, gate electrode 136 and source/drain regions 110 and 111 could be short-circuited.

Therefore, a silicon nitride film to serve as a protection film may be previously formed on gate electrode 136. A method of manufacturing a semiconductor device according to which such a silicon nitride film to serve as a protection film is formed on the gate electrode will be described in conjunction with FIGS. 33 to 40.

Until the state shown in FIG. 25 is attained, the same steps as the manufacturing method described above are performed. As shown in FIG. 33, a silicon nitride film 107 is formed on polycrystalline silicon film 103. Then as shown in FIG. 34, resist film 108 is patterned on silicon nitride film 107. Then using resist film 108 as a mask, etching is performed until a surface of silicon oxide film 104 to be a gate oxide film is exposed, followed by removal of resist film 108 and silicon nitride film 107 to protect polycrystalline silicon film 103 to form a gate electrode as shown in FIG. 35 is formed.

Using polycrystalline silicon film 103 and silicon nitride film 107 as masks, an impurity to form source/drain region 110 is implanted, and a sidewall insulating film such as a sidewall silicon nitride film 109 is formed on the sidewalls of polycrystalline silicon film 103 and silicon nitride film 107. Then, an impurity to form source/drain region 111 is implanted to form an LLD (Lightly Doped Drain) structure and the state as shown in FIG. 36 is attained.

With a refractory metal film being deposited to cover the entire surface of silicon substrate 101, a heat treatment is performed to form a refractory silicide film 106 only on the upper surface of source/drain region 111, then a non-reacted part of the refractory metal film is removed, and the state as shown in FIG. 37 is attained.

An NSG film 114, a silicon nitride film 115 and a BPSG film 116 are sequentially formed to cover the entire surface of silicon substrate 101 in the same steps as those in the conventional manufacturing method according to which a protection film on the gate electrode, and the state as shown in FIG. 38 is attained.

A resist film is patterned to form contact holes 131 and 132 reaching refractory metal silicide film 106 on source/drain region 111, and then BPSG film 116, silicon nitride film 115, and NSG film 114 are sequentially formed on the gate electrode similarly to the conventional manufacturing method according to which a protection film is not formed on the gate electrode, and the state as shown in FIG. 39 is attained. Then, contact plugs 131a and 132a to fill contact holes 131 and 132 are formed, and the state as shown in FIG. 40 is attained.

In the method of manufacturing a semiconductor device according to which a silicon nitride film 107 to be a protection film is formed on polycrystalline silicon film 103 serving as a gate electrode, a refractory metal silicide film cannot be formed on the upper surface of the gate electrode because silicon nitride film 107 is formed immediately above polycrystalline silicon film 103 to form the gate electrode, which lowers the conductivity of the gate electrode.

Japanese Patent Laying-Open Nos. 9-326440 and 8-250603 disclose a technique of forming a refractory metal silicide film on a gate electrode and on a source/drain region, forming a protection film to cover the refractory metal silicide film forming the gate electrode and forming a contact hole to be connected to a source/drain region in a self-aligned manner to the protection film.

According to the invention as disclosed by Japanese Patent Laying-Open Nos. 9-326440 and 8-250603, the refractory metal silicide film formed on the gate electrode is formed by a tungsten silicide film. Thus, the impurity of the polycrystalline silicon film is absorbed by the refractory metal silicide film of a tungsten silicide film or vice versa, in other words, counter diffusion is caused. This counter diffusion disadvantageously causes a depletion layer to form and is conspicuous in miniaturized Dual Gate structures, impeding the scaling down of the semiconductor device.

The step of forming a contact hole reaching the gate electrode and interconnection layer covered by the protection film requires etching to penetrate through the protection film, and therefore cannot be performed simultaneously with the step of forming a contact hole reaching the source/drain region in a self-aligned manner to the protection film to cover the gate electrode as described above. As a result, the steps of forming the contact holes must be performed separately, which requires a large number of steps.

SUMMARY OF THE INVENTION

It is one object of the present invention to provide a further scaled down semiconductor device and a manufacturing method thereof, and another object of the present invention is to reduce the number of steps to form a contact hole reaching a gate electrode having a protection film and an interconnection layer.

A semiconductor device according to the present invention includes a silicon substrate having a first refractory metal silicide film formed by a reaction with a refractory metal film deposited on a main surface on an upper surface of a source/drain region, a gate electrode formed on the silicon substrate in a region between the source/drain regions and having a silicon containing film and a second refractory metal silicide film formed by a reaction of the silicon containing film and a refractory metal film deposited on the silicon containing film, a first insulating film formed to cover a surface of the gate electrode, a second insulating film formed to cover a surface of the first insulating film and the first refractory metal silicide film and etched at a speed higher than the etching speed of the first insulating film under a prescribed etching condition, and a contact hole formed through the second insulating film to reach the surface of one of the source/drain regions.

Thus, since the gate electrode is covered with the first insulating film having an etching speed relatively larger than the second insulating film with a prescribed etching gas, in other words, under a prescribed etching condition, a contact hole to reach the upper surface of one of the source/drain regions may be formed in a self-aligned manner to the first insulating film. Therefore, if the forming position of the contact hole is somewhat shifted to the side of the gate electrode, the gate electrode is protected by the first insulating film. As a result, even if transistors are reduced in size, semiconductor devices can be formed with the current alignment precision.

Since the first and second refractory metal silicide films are formed for example by a reaction of a refractory metal deposited on a silicon containing substrate or film such as a titanium silicide film or cobalt silicide film and the silicon in the substrate or film, when the gate electrode has a polycide structure of a polycrystalline silicon film and a refractory metal silicide film, an impurity included in the polycrystalline silicon film is less absorbed than the refractory metal silicide film including a tungsten silicide film formed by deposition. As a result, a depletion layer is restrained from being formed in the vicinity of the interface between the refractory metal silicide film and polycrystalline silicon film. Thus, the resistance of the gate electrode is reduced, which permits the film thickness and width of the gate electrode to be reduced. Therefore, a semiconductor device reduced in size and having a gate electrode with reduced resistance can be manufactured.

The semiconductor device according to the present invention may further include a buffer film having an expansion coefficient intermediate between the expansion coefficients of the first insulating film and the material forming the gate electrode between the first insulating film and the gate electrode.

Thus, in the manufacturing process of the semiconductor device, if a region having a transistor is heat-treated, stress caused at the gate electrode because of the difference between the first insulating film and gate electrode in the expansion coefficients can be relaxed by the buffer film. As a result, the reliability of the gate electrode is improved and the yield of the devices is improved.

More preferably, in the semiconductor device according to the present invention, the gate electrode includes a polycrystalline silicon film, the first insulating film includes a silicon nitride film and the buffer film formed between the polycrystalline silicon film and the silicon nitride film includes a silicon oxide film.

Thus, the use of the silicon oxide film having an expansion coefficient intermediate between those of the silicon nitride film and polycrystalline silicon film permits the film to serve as a buffer film. Such a silicon oxide film may be formed by thermally oxidizing a side surface of the polycrystalline silicon film forming the gate electrode, a thin buffer film may be formed. This method is therefore suitable for forming a buffer film formed between the gate electrode of the semiconductor device reduced in size and the protection film.

More preferably, in the semiconductor device according to the present invention, the first insulating film includes a silicon nitride film, and the buffer film formed between the second refractory metal silicide film and the silicon nitride film includes a silicon oxide film.

Thus, the silicon oxide film may form the buffer film, and therefore an existing method may be employed.

The semiconductor device according to the present invention may further include a shared contact hole formed through the first and second insulating films and reaching both the gate electrode and the other one of source/drain regions.

Thus, a contact hole is formed to reach one of the source/drain regions in a self-aligned manner, while a shared contact hole is formed to reach the other source/drain region and the gate electrode, and therefore the number of contact holes to form contact plugs is reduced. Therefore, a contact plug may be easily formed if the transistor structure is reduced in size, which permits the semiconductor device to be more scaled down.

More preferably, in the semiconductor device according to the present invention, all the first and second insulating films in the region to form the shared contact hole are removed.

Thus, as compared to the case in which the first insulating film partly remains at the bottom of the shared contact hole, the contact area between the gate electrode and the contact plug filled within the contact hole may be increased. Therefore, the contact resistance between the gate electrode and the contact plug can be reduced, so that the diameter of the contact plug can be reduced. As a result, the contact hole reaching the gate electrode can be more reduced in size, a semiconductor device having even more miniaturized transistor may be formed.

The semiconductor according to the present invention may further include a conductive layer covered with first and second insulating films, and a contact hole formed through the first and second insulating films and reaching the conductive layer.

Thus, the gate electrode and the interconnection layer are both protected by the first and second insulating films, a shared contact hole reaching the gate electrode and the source/drain regions and a contact hole reaching the conductive layer may be formed at a time. Thus, the number of steps required for forming the contact hole reaching the gate electrode having a protection film can be reduced.

A method of manufacturing a semiconductor device according to the present invention includes the steps of forming a first refractory metal silicide film formed by a reaction with a refractory metal film deposited on a main surface on a surface of a silicon substrate in source/drain regions, forming a gate electrode having a silicon containing film and a second refractory metal silicide film formed by a reaction of the silicon containing film and a refractory metal film deposited on the film containing film, forming a first insulating film to cover a surface of the gate electrode, forming a second insulating film to cover the first insulating film and the first refractory metal silicide film at an etching speed higher than that of the first insulating film under a prescribed etching condition, and forming a contact hole through the second insulating film to reach a surface of the source/drain regions.

Thus, since the first insulating film serves as a protection film in the step of etching the second insulating film, the contact hole to reach the upper surface of one source/drain region may be formed in a self-aligned manner to the first insulating film. Therefore, if the contact hole is formed shifted to the side of the gate electrode from the source/drain region, the gate electrode can be protected by the first insulating film. As a result, the yield may be improved in the scaled-down semiconductor device.

Since the second refractory metal silicide film is formed for example by a reaction of a silicon containing film such as a titanium silicide film or a cobalt silicide film and a refractory metal film deposited on the silicon containing film, a gate electrode having lower resistance than the tungsten silicide film formed by deposition is formed. As a result, a gate electrode having desired conductivity can be provided if the thickness of the gate electrode is reduced, so that an even more down-scaled semiconductor device can be manufactured.

By forming the first and second refractory metal silicide film in separate steps, the films may be controlled to have a desired thickness.

The method of manufacturing a semiconductor device according to the present invention may further include the step of forming a buffer film having an expansion coefficient intermediate between those of the first insulating film and the gate electrode before the step of forming the first insulating film after the step of forming the gate electrode.

Thus, a buffer film to relax stress caused at the gate electrode because of the difference between the first insulating film and the gate electrode in the expansion coefficients when a transistor region is heat-treated can be provided. Therefore, a gate electrode with higher reliability can be provided, so that a semiconductor with improved yield can be provided.

More preferably, by the method of manufacturing a semiconductor device according to the present invention, a film containing a polycrystalline silicon film is formed as the gate electrode, a silicon nitride film is formed as the first insulating film, and a silicon oxide film is formed as the buffer film between the polycrystalline silicon film and the first insulating film.

Thus, the use of the silicon oxide film having an expansion coefficient intermediate between those of the silicon nitride film and the polycrystalline silicon film permits the film to serve as a buffer film. The silicon oxide film is formed by thermal oxidation at a side of the polycrystalline silicon film forming the gate electrode, a thin buffer film may be formed. As a result, if a buffer film is provided between the gate electrode and the protection film, a semiconductor device reduced in size may be provided.

More preferably, by the method of manufacturing a semiconductor device according to the present invention, a silicon nitride film is formed as the first insulating film, and a silicon oxide film is formed as a buffer film between the first refractory metal silicide film and the first insulating film.

Thus, an existing method may be employed to form the buffer film with a silicon oxide film, The method of manufacturing a semiconductor device according to the present invention may further include the step of forming a shared contact hole formed by removing the first and second insulating films to expose an upper surface of the gate electrode and an upper surface of the other source/drain region.

Thus, a contact hole may be formed to reach an upper surface of one source/drain region in a self-aligned manner to the first insulating film and a shared contact hole can be formed to reach the other source/drain region and the gate electrode.

More preferably, by the method of manufacturing a semiconductor device according to the present invention, in the step of a shared contact hole, the first and second insulating films in the region to form the shared contact hole are entirely removed.

Thus, as compared to the structure in which the first insulating film partly remains at the bottom of the shared contact hole, the contact area between the gate electrode and the contact plug filled within the contact hole can be increased. Therefore, the diameter of the contact plug can be reduced. As a result, the transistor structure can be further down-scaled, so that the semiconductor device may be even more reduced in size.

By the method of manufacturing a semiconductor device according to the present invention, in the step of forming a shared contact hole, a contact hole to expose a surface of the conductive layer covered with the first and second insulating films may be further formed in said first and second insulating films.

Thus, a shared contact hole reaching the gate electrode and an upper surface of the source/drain region and a contact hole reaching the conductive layer can be formed at a time, so that the number of steps included in the manufacture of a semiconductor device can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be now described in conjunction with the accompanying drawings.

First Embodiment

Figure 1:
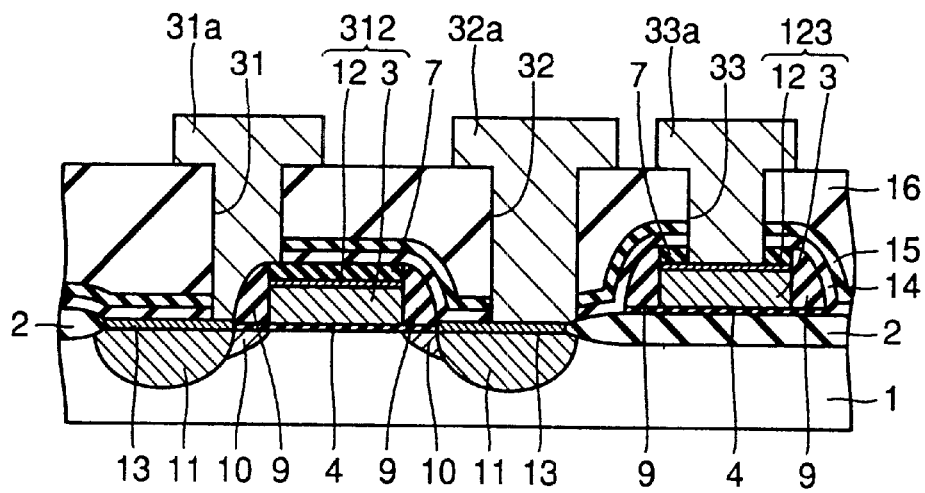
FIG. 1 is a cross sectional view of a semiconductor device according to a first embodiment of the present invention.

The structure of a semiconductor device according to an embodiment of the present invention will be now described in conjunction with FIG. 1. The semiconductor device according to the embodiment has source/drain regions 10, 11 formed on a silicon substrate 1 in an element isolation region isolated by an isolation oxide film 2. A cobalt silicide film 13 is formed on a surface of silicon substrate 1 in source/drain regions 10, 11.

Formed on silicon substrate 1 between source/drain regions 10 and 11 are a gate electrode 312 of a polycrystalline silicon film 3 and a cobalt silicide film 12 with cobalt silicide film 12 positioned above. A silicon nitride film 7 is formed to cover an upper surface of gate electrode 312. A sidewall silicon nitride film 9 is formed on a sidewall of gate electrode 312. An interconnection layer 123 having a polycide structure of polycrystalline silicon film 3 and cobalt silicide film 12 is formed on isolation oxide film 2 with cobalt silicide film 12 positioned above.

An NSG film 14 is formed to cover part of silicon nitride film 7, sidewall silicon nitride film 9 and cobalt silicide film 13 and isolation oxide film 2 and interconnection layer 123. A silicon nitride film 15 is formed to cover NSG film 14. A BPSG film 16 is formed to cover silicon nitride film 15.

A contact hole 31 is formed through BPSG film 16, silicon nitride film 15 and NSG film 14 to reach an upper surface of one of source/drain regions 10 and 11. A contact hole 32 is formed through BPSG film 16, silicon nitride film 15 and NSG film 14 to reach an upper surface of the other one of source/drain regions 10 and 11. A contact hole 33 is formed through BPSG film 16, silicon nitride film 15 and NSG film 14 to reach an upper surface of interconnection layer 123 formed on isolation oxide film 2. Contact holes 31, 32 and 33 are filled with conductive contact plugs 31a, 32a and 33a so that source/drain regions 10, 11 and interconnection layer 123 can connect other conductive layers.

Thus, since gate electrode 312 is covered with a silicon nitride film 7 having an etching speed lower than that of NSG film 14 under a prescribed etching condition, contact hole 31 reaching an upper surface of one of source/drain regions 10, 11 may be formed in a self-aligned manner to silicon nitride film 7 and sidewall nitride film 9. Thus, if the position of forming contact hole 31 is somewhat shifted to the side of gate electrode 312, gate electrode 312 is protected by silicon nitride film 7 and sidewall nitride film 9. As a result, if the transistor structure is reduced in size, the semiconductor device can be formed with the current alignment precision.

In this embodiment, the refractory metal silicide film forming gate electrode 312 is cobalt silicide film 12, less impurity contained in polycrystalline silicon film 3 is absorbed than the case of the refractory metal silicide film including a tungsten silicide film. As a result, a depletion layer is restrained from being formed at the interface between the refractory metal silicide film and the polycrystalline silicon film. Therefore, the resistance of gate electrode 312 is lowered, which permits the width and thickness of gate electrode 312 to be reduced. As a result, a semiconductor device reduced in size and having gate electrode 312 with lowered resistance can be manufactured.

Figure 13:
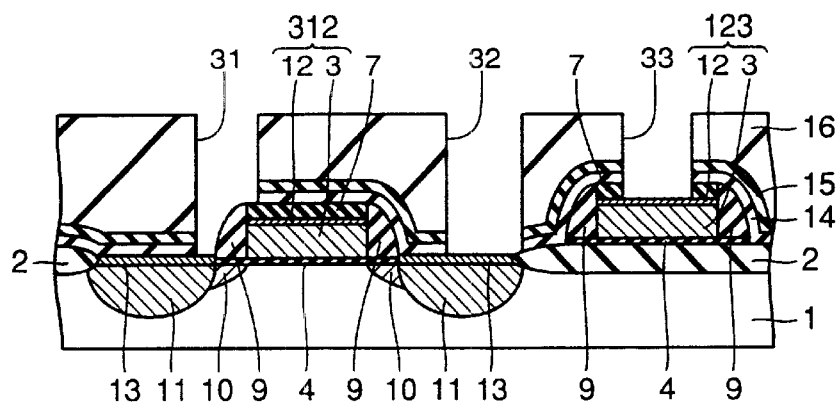
FIG. 13 is a view of a cross section immediately after a contact hole is formed in an interconnection layer on the isolation oxide film in the method of manufacturing the semiconductor device according to the first embodiment.
Figure 22:
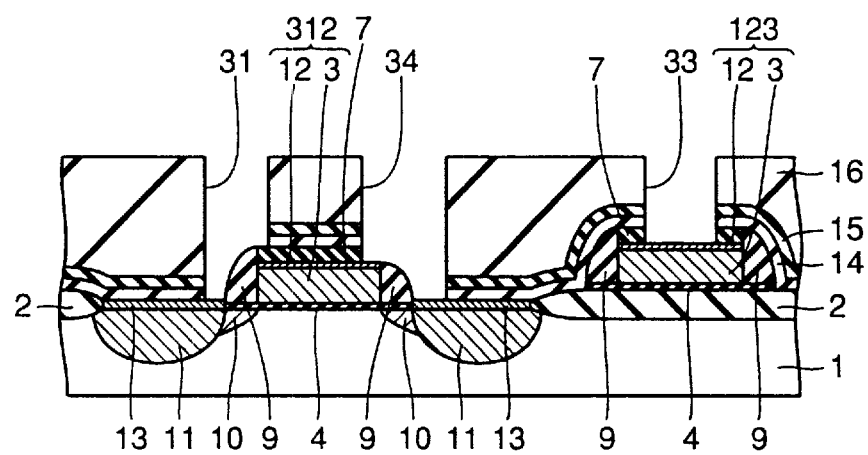
FIG. 22 is a view of a cross section immediately after forming the shared contact hole reaching the gate electrode and source/drain region and contact hole reaching the interconnection layer in the BPSG film, silicon nitride film and NSG film by etching in the method of manufacturing the semiconductor device according to the third embodiment.

A method of manufacturing the semiconductor device according to the first embodiment will be now described in conjunction with FIGS. 22 to 13. By the method of manufacturing the semiconductor device according to this embodiment, isolation oxide film 2 to isolate an element forming regions is formed on p-type silicon substrate 1. After forming an oxide film having a thickness of 15 nm in the element isolation region, the element isolation region is implanted with an impurity to form a well region in the element isolation region, using the oxide film as a protection film.

Figure 2:
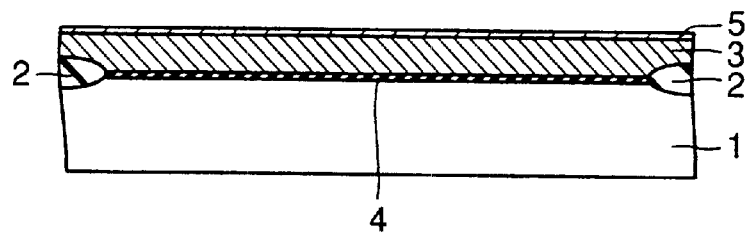
FIG. 2 is a view of a cross section immediately after a cobalt film is formed on a polycrystalline silicon film in a method of manufacturing the semiconductor device according to the first embodiment.

Thereafter, the oxide film on the element forming region is removed by wet etching. Then, a silicon oxide film 4 as thick as 3 nm for example to be a gate insulting film is formed in the element forming region. Then, a polycrystalline silicon film 3 as thick as 200 nm is formed on silicon oxide film 4. A cobalt film 5 as thick as 10 nm is formed on polycrystalline silicon film 3 and the state as shown in FIG. 2 is attained.

Figure 3:
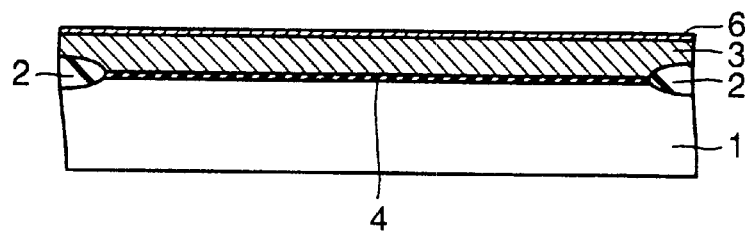
FIG. 3 is a cross sectional view immediately after forming a cobalt silicide film by heat-treating a cobalt film formed on a polycrystalline silicon film in the method of manufacturing the semiconductor device according to the first embodiment.
Figure 4:
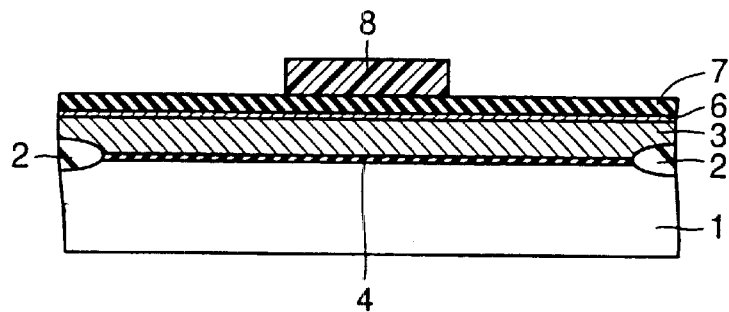
FIG. 4 is a view of a cross section immediately after pattering a resist film on a silicon nitride film in the method of manufacturing the semiconductor device according to the first embodiment.
Figure 5:
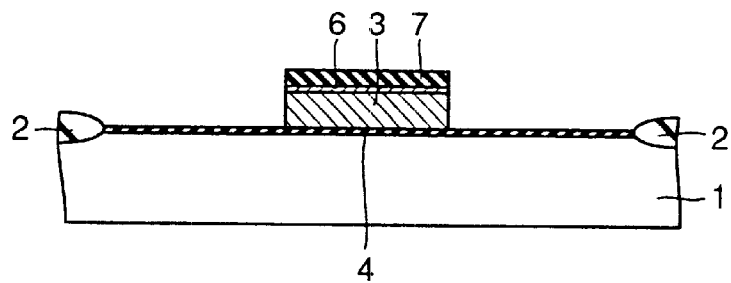
FIG. 5 is a view of a cross section immediately after a gate electrode is formed by etching the cobalt silicide film and the polycrystalline silicon film using the resist film as a mask in the method of manufacturing the semiconductor device according to the first embodiment.

As shown in FIG. 3, lamp annealing is performed at a temperature of 450° C. for 30 seconds to form COxSiy, in other words, a cobalt silicide film 6, followed by removal of non-reacted cobalt film 5. Then, an insulating film such as a silicon nitride film 7 is deposited on cobalt silicide film 6, and a resist film 8 is patterned on silicon nitride film 7, and the state as shown in FIG. 4 is attained. Then, using resist film 8 as a mask, etching is performed until silicon oxide film 4 to be the gate oxide film is exposed. Resist film 8 is then removed and silicon oxide film 4 as shown in FIG. 5 is formed. The etching process from the state in FIG. 4 to the state in FIG. 5 may be performed until cobalt silicide film 6 is exposed, followed by removal of resist film 8, and etching may be performed using silicon nitride film 7 as a hard mask until silicon oxide film 4 is exposed. Then, silicon oxide film 4 may be exposed as shown in FIG. 5.

Figure 6:
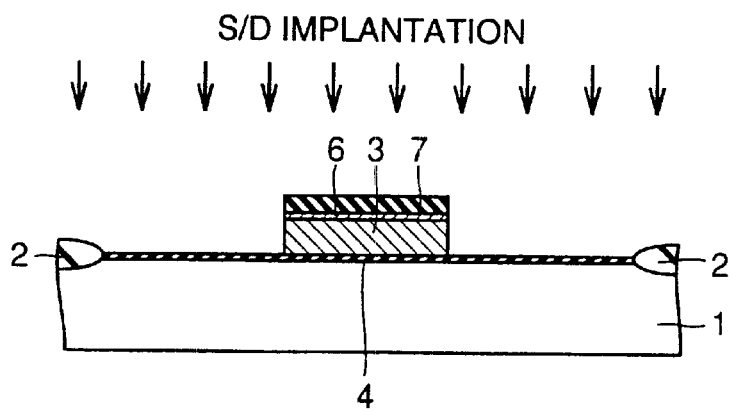
FIG. 6 is a view of a cross section when an impurity is implanted into a silicon substrate in a self-aligned manner to the gate electrode and an isolation oxide film in the method of manufacturing the semiconductor device according to the first embodiment.
Figure 7:
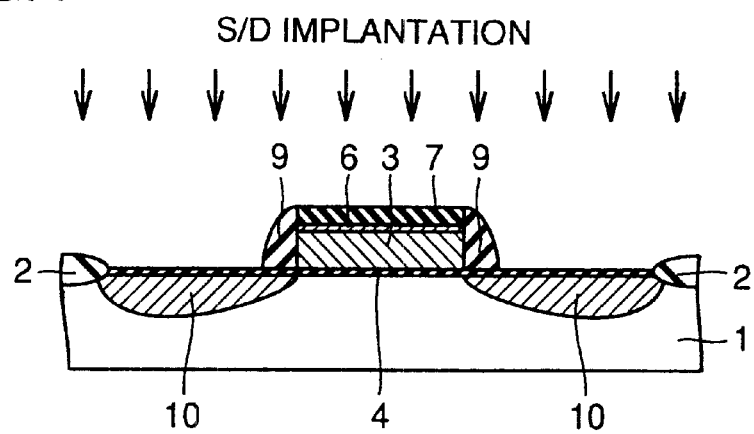
FIG. 7 is a view of a cross section immediately after the impurity is implanted into the silicon substrate in a self-aligned manner to the gate electrode, a sidewall silicon nitride film and the isolation oxide film in the method of manufacturing the semiconductor device according to the first embodiment.

As shown in FIG. 6, an impurity to form source/drain regions 10 is implanted, and then a sidewall insulating film such as a sidewall silicon nitride film 9 is formed as shown in FIG. 7. Then, an impurity to form source/drain region 11 is further implanted and an LDD structure results.

Figure 8:
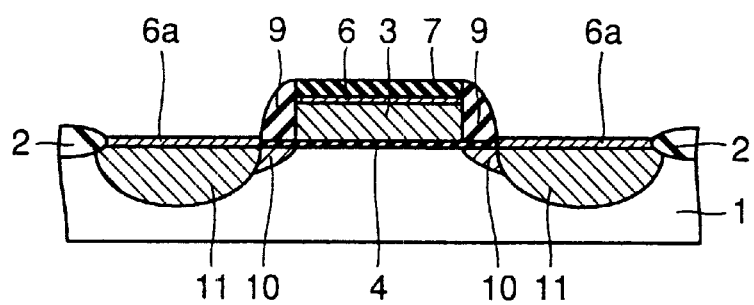
FIG. 8 is a view of a cross section immediately after a surface of a source/drain region is formed into silicide in the method of manufacturing the semiconductor device according to the first embodiment.

Then, after the process of activating the implanted impurity, a cobalt film as thick as 8 nm is deposited, followed by lamp annealing at a temperature of 450° C. for 30 seconds to form a cobalt silicide film 6a as shown in FIG. 8, and a non-reacting part of the cobalt film is removed.

Figure 9:
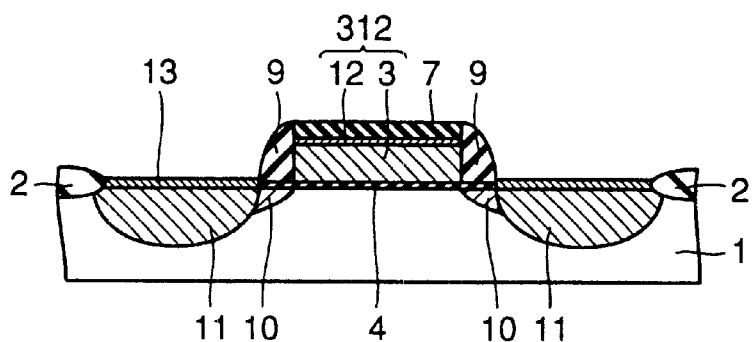
FIG. 9 is a view of a cross section immediately after a cobalt silicide film is further heat-treated to reduce the resistance in the method of manufacturing the semiconductor device according to the first embodiment.

As shown in FIG. 9, cobalt silicide films 6 and 6a are subjected to lamp annealing at a temperature of 900° C. for 30 seconds and formed into cobalt silicide films 12 and 13 with lowered resistance, respectively. Thus, a polycide, gate electrode 312 of polycrystalline silicon film 3 and cobalt silicide film 12 and source/drain regions 10 and 11 having lowered resistance are formed.

Figure 10:
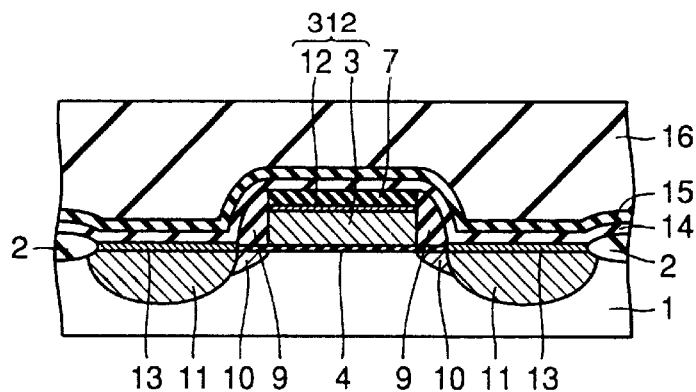
FIG. 10 is a view of a cross section immediately after an interlayer insulating film of an NSG film, a silicon nitride film and a BPSG film is formed in the method of manufacturing the semiconductor device according to the first embodiment.

An NSG film 14 is then formed to cover the entire surface of silicon substrate 1. Then, a silicon nitride film 15 is formed on NSG film 14. A BPSG film 16 is formed on silicon nitride film 15. Then, the surface of BPSG film 16 is flattened by CMP, and the state as shown in FIG. 10 is attained.

Figure 11:
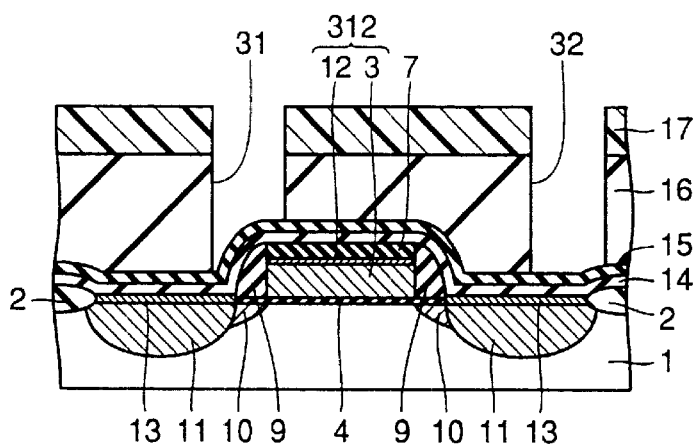
FIG. 11 is a view of a cross section immediately after a contact hole is firmed through a BPSG film in the method of manufacturing the semiconductor device according to the first embodiment.

A resist film 17 is patterned as shown in FIG. 11 in order to form contact holes 31 and 32 reaching source/drain regions 10 and 11, a resist film 17 is patterned and then etching is performed until silicon nitride film 15 is exposed. At this time, silicon nitride film 15 serves as an etching stopper.

Figure 12:
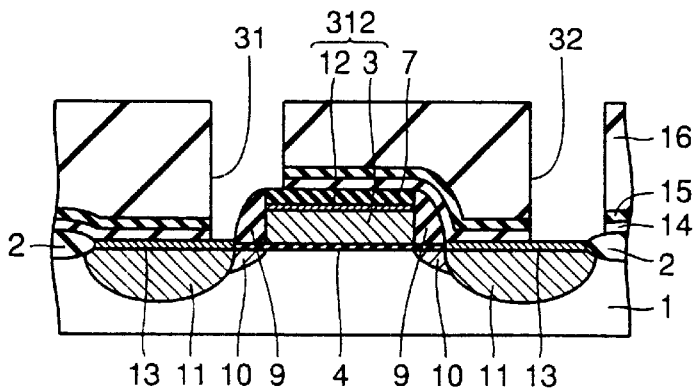
FIG. 12 is a view of a cross section immediately after a contact hole is formed in the NSG film and silicon nitride film in the method of manufacturing the semiconductor device according to the first embodiment.

Then as shown in FIG. 12, contact holes 31 and 32 are further deepened as to sequentially etch silicon nitride film 15 and NSG film 14, and a surface of cobalt silicide film 13 is exposed. At this time, contact hole 31 is formed in a self-aligned manner to silicon nitride film 7 and sidewall silicon nitride film 9. More specifically, silicon nitride film 7 and sidewall silicon nitride 9 serve as an etching stopper to prevent cobalt silicide film 12 from being etched.

After forming contact holes 31 and 32 reaching another gate electrode 312 and source/drain regions 10 and 11, BPSG film 16, silicon nitride film 15 and NSG film 14 are sequentially etched to form a contact hole 33 reaching another interconnection layer 123, and the state as shown in FIG. 13 is attained. Thereafter, contact plugs 31a, 32a and 33a are filled within contact holes 31, 32 and 33, such that a semiconductor device as shown in FIG. 1 results.

When contact hole 31 formed by the above-described method is shifted from the appropriate position on gate electrode 312 as shown in FIG. 13, silicon nitride film 7 and sidewall silicon nitride film 9 are present to cover the upper surface and sidewall of gate electrode 312, contact hole 31 is formed in a self-aligned manner to sidewall silicon nitride film 9 and silicon nitride film 7. Thus, when contact plug 31a is filed within contact hole 31, source/drain region 11 and gate electrode 312 are restrained from being short-circuited. As a result, contact hole 31 can be formed without taking into account errors, the semiconductor device can be reduced in size.

Since cobalt silicide film 12 is formed on gate electrode 312, the impurity is restrained from being absorbed, unlike the case of the gate electrode which forms the polycide structure with a tungsten silicide film. As a result, a depletion layer is prevented from being formed at the interface between the polycrystalline silicon film and the refractory metal silicide film, so that the resistance of gate electrode 312 can be reduced.

Furthermore, by the method of manufacturing a semiconductor device according to the present embodiment, the steps of depositing cobalt films on gate electrode 312 and source/drain regions 10 and 11 are separately performed, cobalt silicide films 12 and 13 can be formed into thickness suitable for applications. Cobalt silicide film 12 is formed to have a thickness to withstand etching for forming gate electrode 312. Cobalt silicide film 13 is formed to have such a thickness not to contact a well region if the film increases in thickness, in other words, such a thickness that junction leakage current will not be generated between source/drain regions 10, 11 and the well region.

Note that polycrystalline silicon film 3 could provide the same effect whether it is doped or not doped. However, when non-doped silicon is used, process for reducing the resistance, e.g., additional steps such as implantation will be necessary.

In this embodiment, the interlayer insulating film is formed by NSG film 14, silicon nitride film 15 and BPSG film 16, interlayer insulating films of other structures will not affect the above.

In this embodiment, silicon nitride film 7 and sidewall silicon nitride film 9 are used as protection films for gate electrodes, any other materials may be employed as long as the materials can secure higher etching speed than silicon nitride film 15. Silicon nitride film 15 may be replaced by any other material as long as the material can secure lower etching speed than BPSG film 16.

The same effects can be provided if the order of forming contact hole 31 formed in a self-aligned manner to source/drain region 11 and contact hole 33 formed in a self-aligned manner to interconnection 123 is reversed.

Second Embodiment

Figure 14:
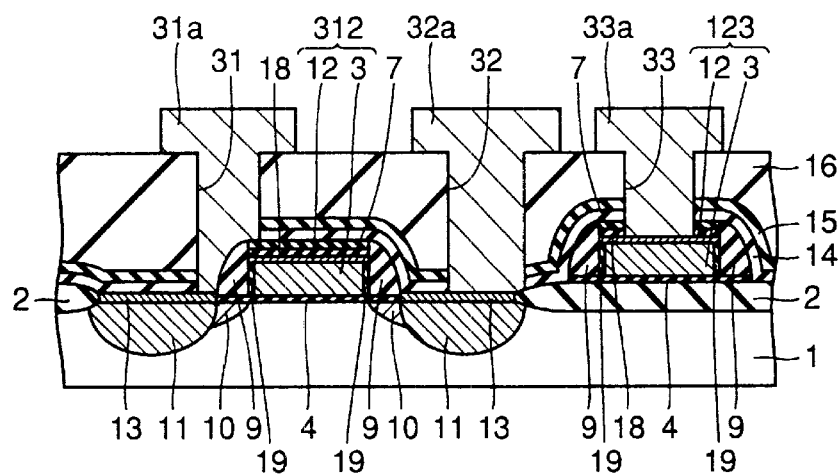
FIG. 14 is a view of a cross section of a semiconductor device according to a second embodiment of the present invention.

A semiconductor device according to this embodiment will be now described in conjunction with FIG. 14. The semiconductor device according to this embodiment includes in addition to the structure of the semiconductor device according to the first embodiment described in conjunction with FIG. 1, a silicon oxide film 19 to serve as a buffer film having an expansion coefficient intermediate between those of silicon oxide film 7 and polycrystalline silicon film 3 between silicon nitride film 7 and polycrystalline silicon film 3 constituting gate electrode 312. There is also formed a silicon oxide film 18 to serve as a buffer film having an expansion coefficient intermediate between those of silicon nitride film 7 and cobalt silicide film 12 between silicon nitride film 7 and cobalt silicide film 12.

Thus, in the process of manufacturing a semiconductor device, when a transistor region is heat-treated, the buffer films can relax physical stress generated at gate electrode 312 because of difference in the expansion coefficients between silicon nitride film 7 and cobalt silicide film 12, and between silicon nitride film 7 and polycrystalline silicon film 3. Thus, the reliability of gate electrode 312 can be improved, so that the yield of the semiconductor devices can be improved.

Silicon oxide film 18 having an intermediate expansion coefficient between silicon nitride film 7 and polycrystalline silicon film 3 serves as a buffer film, silicon oxide film 18 may be formed by thermally oxidizing the sidewall of polycrystalline silicon film 3 forming gate electrode 312, and therefore a thin buffer film may be formed. Thus, this is suitable for the method of forming a buffer film between the gate electrode 312 of the semiconductor device reduced in size and silicon nitride film 7 as a protection film. Since the buffer film is formed by an oxide film, an existing manufacturing method can be employed.

A method of manufacturing the semiconductor device according to the second embodiment will be now described in conjunction with FIGS. 14 to 18. The manufacturing method according to the second embodiment includes the same steps until the state as shown in FIG. 3 is attained.

A silicon oxide film 18 of TEOS (Tetra Ethyl Ortho Silicate) is formed on cobalt silicide film 6. Then, a silicon nitride film 7 is formed on silicon oxide film 18.

Figure 15:
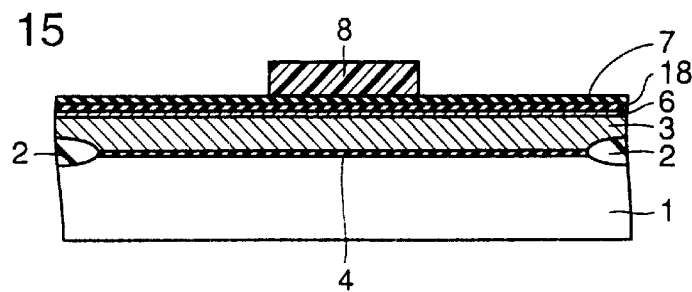
FIG. 15 is a view of a cross section immediately after patterning a resist film on a silicon oxide film in a method of manufacturing the semiconductor device according to the second embodiment.
Figure 16:
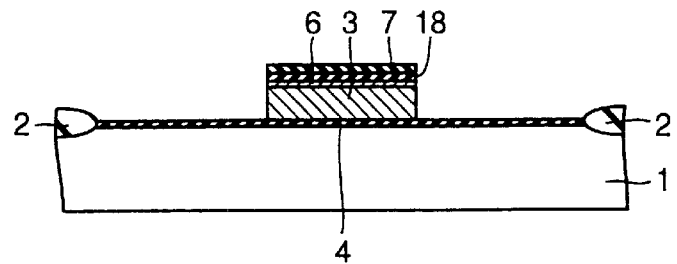
FIG. 16 is a view of a cross section immediately after forming a gate electrode by etching using a resist film as a mask in the method of manufacturing the semiconductor device according to the second embodiment.
Figure 17:
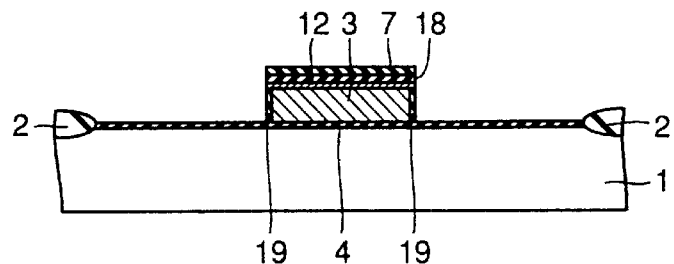
FIG. 17 is a view of a cross section immediately after a thermal oxide film is formed on a sidewall of the gate electrode in the method of manufacturing the semiconductor device according to the second embodiment.
Figure 18:
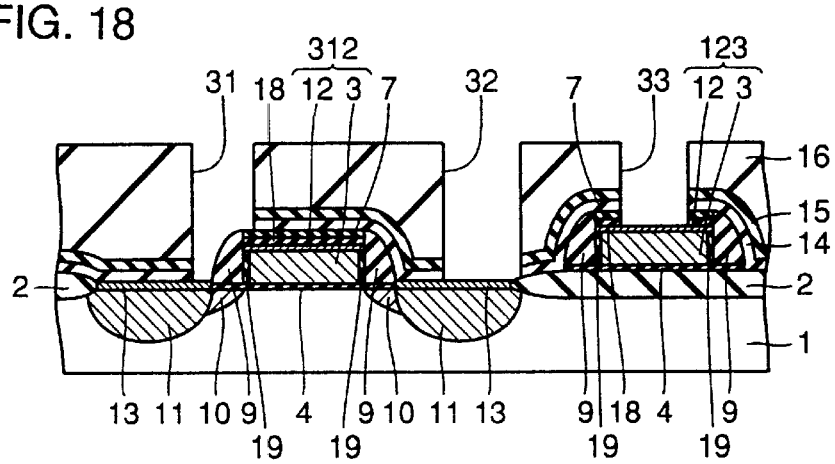
FIG. 18 is a view of a cross section immediately after a contact hole is formed through an NSG film, a silicon nitride film and a BPSG film to reach the gate electrode, interconnection layer and a source/drain region in the method of manufacturing the semiconductor device according to the second embodiment.

Then as shown in FIG. 15, a resist film 8 is patterned, which is used as a mask as etching is performed to expose a surface of silicon oxide film 4 to be a gate insulating film. Then, resist film 8 is removed, gate electrode 312 is formed either to attain the state as shown in FIG. 16 or etching is perform until cobalt silicide film 6 is exposed, followed by removal of resist film 8, etching is performed using silicon nitride film 7 and oxide film 18 as masks until silicon oxide film 4 is exposed to form a gate electrode, and the state as shown in FIG. 16 is attained. Then, as shown in FIG. 17, thermal oxidation is performed to form a sidewall oxide film 19 on the sidewall of polycrystalline silicon film 3. Then, similarly to the process according to the first embodiment as shown in FIGS. 6 to 9, cobalt silicide films 13 and 12 are formed on source/drain regions 10, 11 and polycrystalline silicon film 3. Then, similarly to the process according to the first embodiment as shown in FIG. 10, NSG film 14, silicon nitride film 15 and BPSG film 16 are formed. Then, similarly to the process as shown in FIGS. 11 to 13, in order to form contact holes 31, 32 and 33 reaching cobalt silicide films 13, 12 on source/drain region 11 and cobalt silicide film 12 on interconnection layer 123, etching is sequentially performed until surfaces of BPSG film 116, silicon nitride film 15, NSG film 14 and cobalt silicide film 12 are exposed, and the state as shown in FIG. 18 is attained. Then, contact plugs 31a, 32a and 33a are formed to fill contact holes 31, 32 and 33 and the state shown in FIG. 14 is attained.

By this method, in addition to the effects of the first embodiment that the semiconductor device can be reduced in size, silicon oxide film 18 to serve as a buffer film having an expansion coefficient intermediate between those of cobalt silicide film 12 and silicon nitride film 7 can be provided between these films. Therefore, physical stress applied by silicon nitride film 7 upon gate electrode 312 because of difference in the expansion coefficient between cobalt silicide film 12 and silicon nitride film 7 can be relaxed. Sidewall silicon oxide film 19 to serve as a buffer film having an intermediate expansion coefficient between polycrystalline silicon film 3 and sidewall silicon nitride film 9 between gate electrode 312 and nitride film 9, so that physical stress applied by sidewall silicon nitride film 9 upon gate electrode 312 because of difference in the expansion coefficient between polycrystalline silicon film 3 and sidewall silicon nitride film 9 can be relaxed.

In this embodiment, silicon oxide films 18 and 19 to serve as a buffer film are formed on two positions, i.e., on the upper side and sidewall of gate electrode 312, a single buffer film may be independently formed on either one of the two positions for each effect.

Third Embodiment

Figure 19:
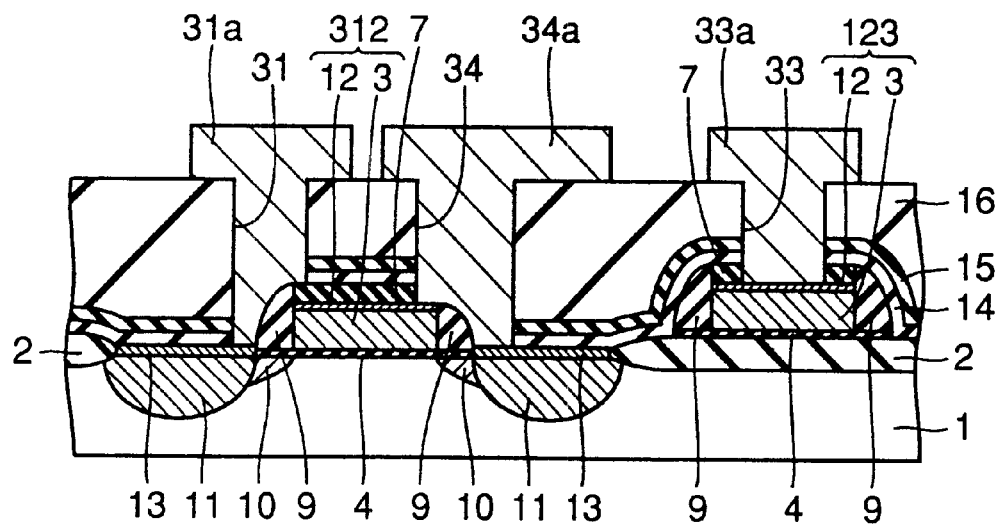
FIG. 19 is a view of a cross section of a semiconductor device according to a third embodiment of the present invention.

A semiconductor device according to a third embodiment of the present invention will be now described in conjunction with FIG. 19. In the semiconductor device according to the present embodiment, in place of contact hole 32 to connect source/drain region 10, 11, a shared contact hole 34 is formed to reach both cobalt silicide film 12 on gate electrode 312 and the other cobalt silicide film 13 on source/drain region 10, 11. Shared contact hole 34 is filled with contact plug 34a.

Thus, contact hole 31 is formed in a self-aligned manner to silicon nitride film 7 and sidewall silicon nitride film 9 and reaching one source/drain region 10, 11, while shared contact hole 34 is formed to reach the other source/drain region 10, 11 and gate electrode 312.

In this structure, the upper surfaces of gate electrode 312 and interconnection layer 123 are both protected by silicon nitride film 7, and therefore the penetration of contact holes does not have to be taken into account. Thus, shared contact hole 34 reaching gate electrode 312 and source/drain region 10, 11 and contact hole 33 reaching interconnection layer 123 can be formed at the same time in the same etching step. Therefore, the number of steps included in forming shared contact hole 34 reaching gate electrode 312 having silicon nitride film as a protection film and contact hole 33 reaching interconnection layer 123 can be reduced.

Figure 20:
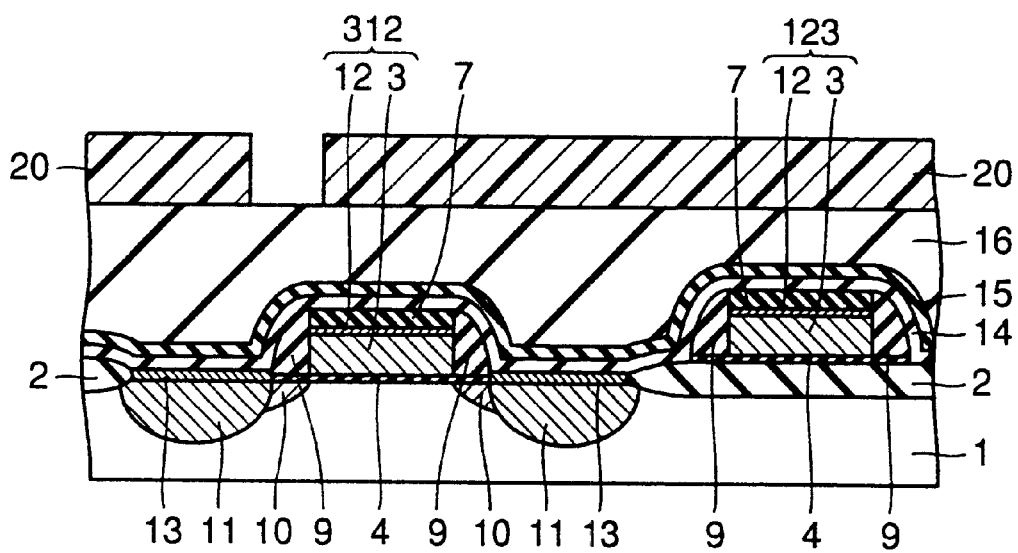
FIG. 20 is a view of a cross section immediately after a resist film to form a contact hole reaching the source/drain region on the BPSG film in a method of manufacturing the semiconductor device according to the third embodiment.

A method of manufacturing the semiconductor device according to the third embodiment will be now described in conjunction with FIGS. 19 to 22. The method of manufacturing the semiconductor device according to the third embodiment includes the same steps in the method of manufacturing the semiconductor device according to the first embodiment as shown in FIGS. 2 to 10. Then, as shown in FIG. 20, a resist film 20 to form a contact hole toward one of source/drain region 10, 11 is patterned. The etching process is performed similarly to the first embodiment and a contact hole 31 is formed. Thus, contact hole 31 has the same structure as that of the SAC structure described in connection with the first embodiment. The, resist film 20 is removed.

Figure 21:
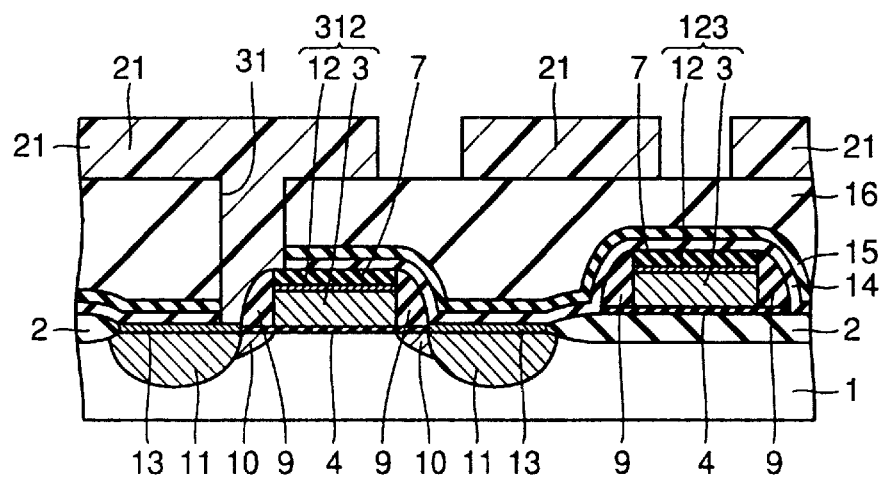
FIG. 21 is a view of a cross section immediately after forming a resist film to form a shared contact hole contact hole filling the contact hole connected to the source/drain region and reaching the gate electrode and source/drain region and a contact hole reaching the interconnection layer.

As shown in FIG. 21, contact hole 31 is filled, a resist film 21 is patterned to form shared contact hole 34 reaching source/drain region 10, 11 and gate electrode 312 and contact hole 33 reaching interconnection layer 123 at the same time. Then, etching is performed until cobalt silicide films 12 and 13 on source/drain regions 10, 11, gate electrode 312, and interconnection layer 123 are exposed, so that shared contact hole 34 reaching gate electrode 312 and source/drain region 10, 11 and contact hole 33 reaching interconnection layer 123 are formed. Then resist film 20 is removed and the state as shown in FIG. 22 is attained. Then, contact plugs 31a, 33a and 34a to fill contact holes 31, 33 and shared contact hole 34 are formed and the state as shown in FIG. 19 is attained.

Thus, different contact holes, i.e., contact holes 31 and 33, and shared contact hole 34 can be formed by only two etching steps. Therefore, the number of steps included in forming the contact holes can be reduced. One shared contact hole 34 reaches both gate electrode 312 and source/drain region 10, 11, and therefore a transistor can be formed in a two-dimensionally small region. As a result, the area required for cells in an SRAM (Static Random Access Memory) can be reduced.

Fourth Embodiment

Figure 23:
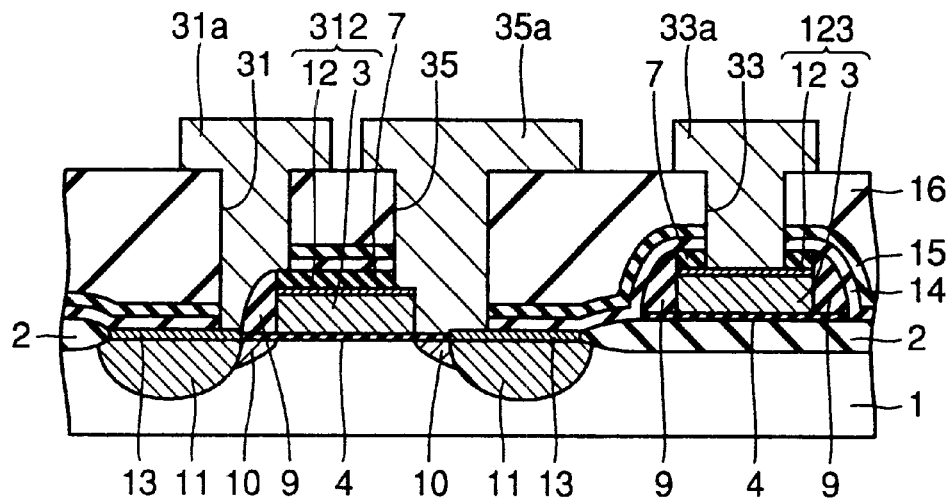
FIG. 23 is a view of a cross section of a semiconductor device according to a fourth embodiment of the present invention.

A semiconductor device according to a fourth embodiment of the present invention will be now described in conjunction with FIG. 23. The semiconductor device according to this embodiment includes, in the structure of the semiconductor device according to the third embodiment described in conjunction with FIG. 19, in place of shared contact hole 34, a shared contact hole 35 formed by removing sidewall silicon nitride film 9 under shared contact hole 34 is formed. Shared contact hole 35 is filled with a contact plug 35a to connect with other conductive layers.

Thus, compared to the structure of the semiconductor device according to the third embodiment in which sidewall silicon nitride film 9 remains under shared contact hole 34, the contact area between gate electrode 312 and contact plug 35a filled within shared contact hole 35 can be increased. Therefore, contact hole 35 reaching gate electrode 312 can be further reduced in size, so that a semiconductor device even more reduced in size can be formed.

Figure 24:
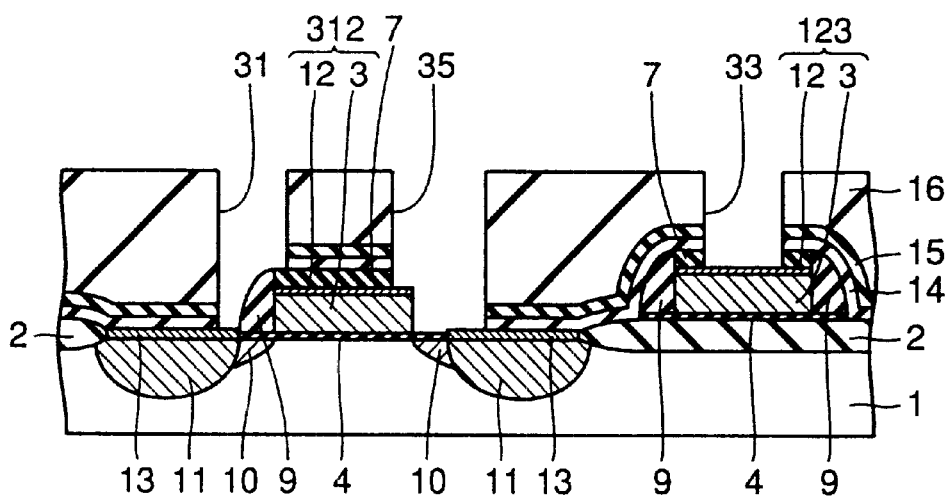
FIG. 24 is a view of a cross section immediately after a sidewall nitride film positioned under the shared contact hole is further etched from the state shown in FIG. 22 in a method of manufacturing the semiconductor device according to the fourth embodiment.
Figure 25:
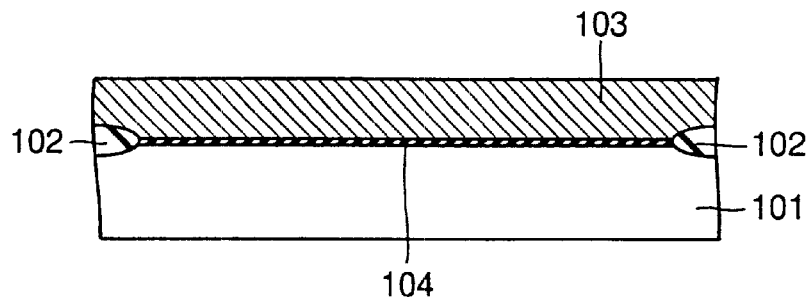
FIG. 25 is a view of a cross section immediately after a polycrystalline silicon film is formed on a silicon oxide film in a method of manufacturing a conventional semiconductor device.
Figure 26:
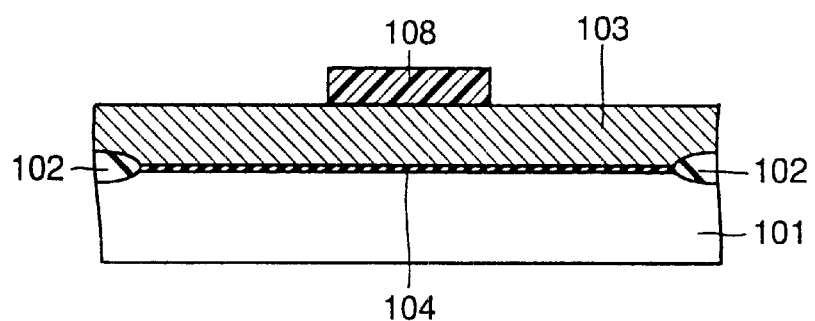
FIG. 26 is a view of a cross section immediately after a resist film is patterned on a polycrystalline silicon film in the method of manufacturing the conventional semiconductor device having a refractory metal silicide film on the gate electrode.
Figure 27:
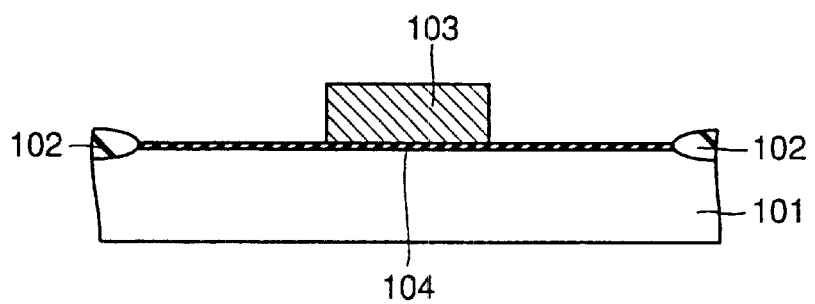
FIG. 27 is a view of a cross section immediately after a gate electrode is formed by etching a polycrystalline silicon film using a resist film as a mask in the method of manufacturing the conventional semiconductor device having a refractory metal silicide film on the gate electrode.
Figure 28:
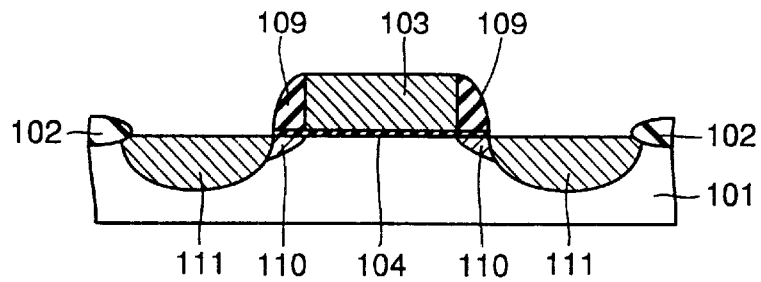
FIG. 28 is a view of a cross section immediately after an impurity is implanted in a self-aligned manner to the gate electrode, sidewall silicon nitride film and isolation oxide film in the method of manufacturing the conventional semiconductor device having a refractory metal silicide film on the gate electrode.
Figure 29:
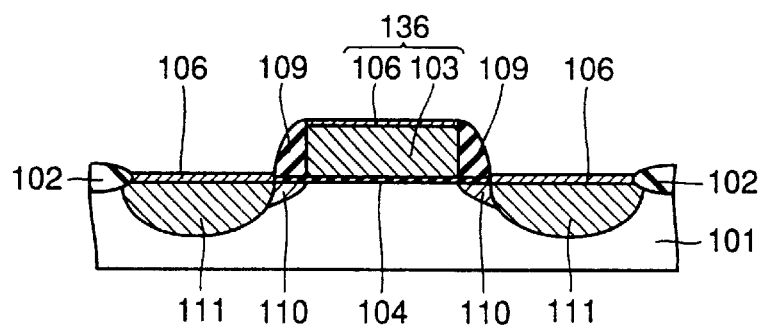
FIG. 29 is a view of a cross section immediately after an upper surface of the gate electrode and an upper surface of a source/drain region are formed into silicide at a time in the method of manufacturing the conventional semiconductor device having a refractory metal silicide film on a gate electrode.
Figure 30:
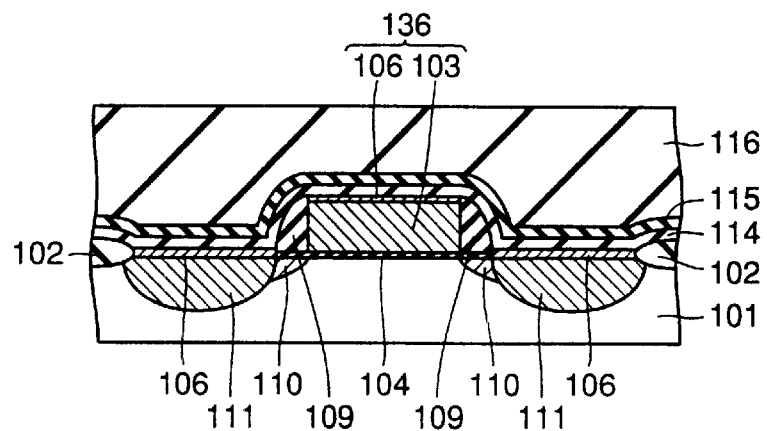
FIG. 30 is a view of a cross section immediately after an interlayer insulating film of an NSG film, a silicon nitride film and a BPSG film is formed in the method of manufacturing the conventional semiconductor device having a refractory metal silicide film on the gate electrode.
Figure 31:
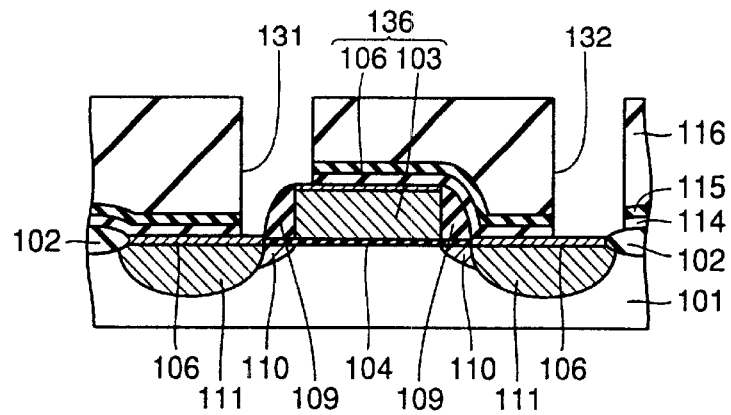
FIG. 31 is a view of a cross section immediately after a contact hole through the BPSG film, silicon nitride film and NSG film is formed in the method of manufacturing the conventional semiconductor device having a refractory metal silicide film on a gate electrode.
Figure 32:
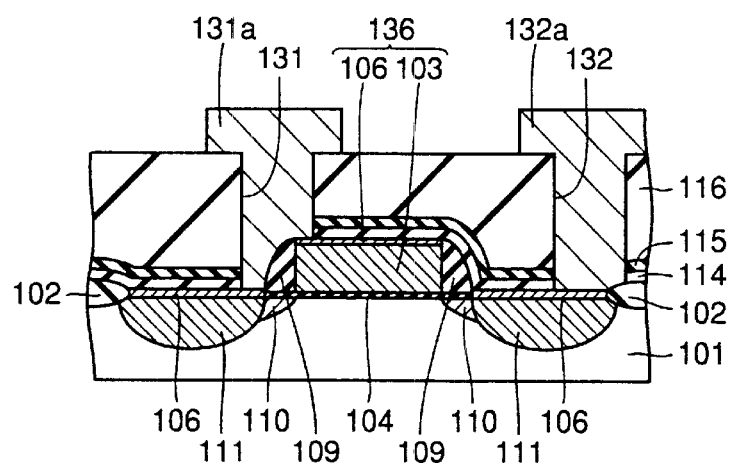
FIG. 32 is a view of a cross section of a conventional semiconductor device having a refractory metal silicide film on the gate electrode.
Figure 33:
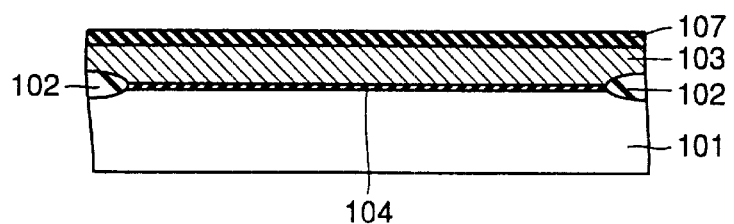
FIG. 33 is a view of a cross section immediately after a silicon nitride film is formed on a polycrystalline silicon film in a method of manufacturing a conventional semiconductor device having a protection film on the gate electrode.
Figure 34:
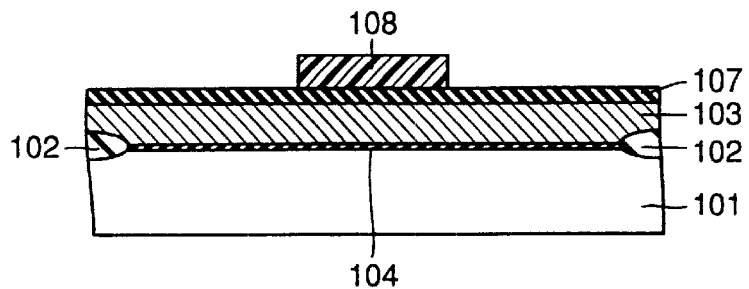
FIG. 34 is a view of a cross section immediately after a resist film is patterned on a silicon nitride film in the method of manufacturing the conventional semiconductor device having a protection film on a gate electrode.
Figure 35:
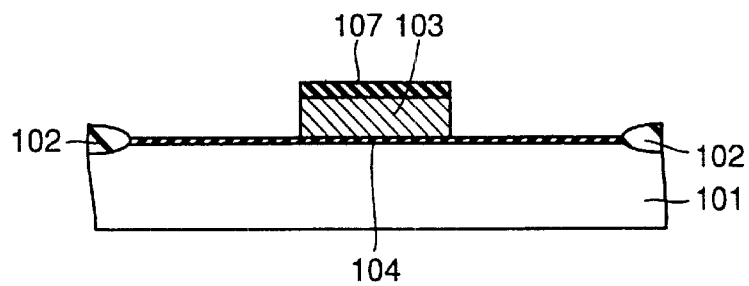
FIG. 35 is a view of a cross section immediately after a gate electrode is formed by etching a polycrystalline silicon film using a resist film as a mask in the method of manufacturing the conventional semiconductor device having a protection film on the gate electrode.
Figure 36:
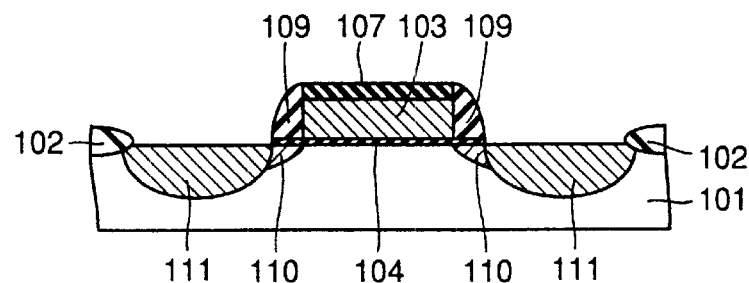
FIG. 36 is a view of a cross section immediately after an impurity is implanted in a self-aligned manner to the gate electrode, silicon nitride film and isolation oxide film in the method of manufacturing the conventional semiconductor device having a protection film on the gate electrode.
Figure 37:
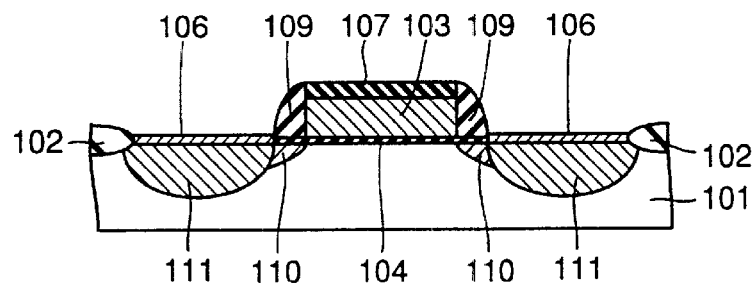
FIG. 37 is a view of a cross section immediately after a surface of a source/drain region is formed into silicide in the method of manufacturing the conventional semiconductor device having a protection film on the gate electrode.
Figure 38:
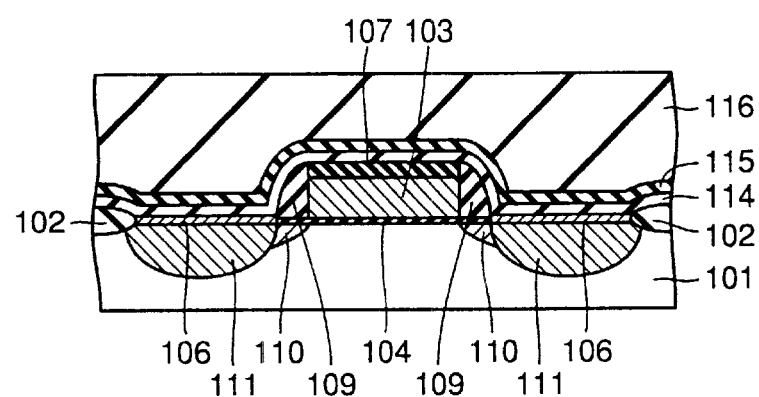
FIG. 38 is a view of a cross section immediately after an interlayer insulating film of an NSG film, a silicon nitride film and a BPSG film is formed in the method of manufacturing the conventional semiconductor device having a protection film on the gate electrode.
Figure 39:
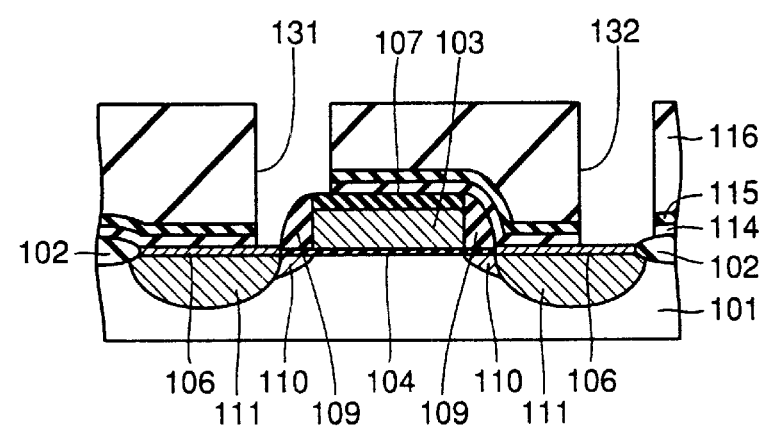
FIG. 39 is a view of a cross section immediately after a contact hole through the BPSG film, silicon nitride film and NSG film is formed in the method of manufacturing the conventional semiconductor device having a protection film on the gate electrode.
Figure 40:
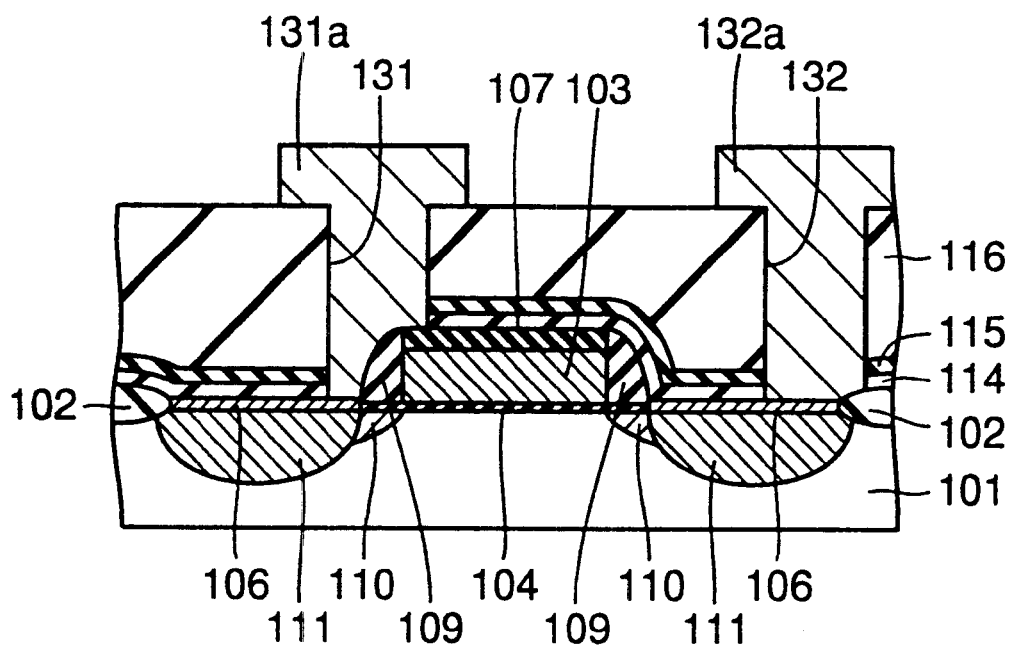
FIG. 40 is a view of a cross section of a conventional semiconductor device having a refractory metal silicide film on the gate electrode.

A method of manufacturing the semiconductor device according to the fourth embodiment will be now described in conjunction with FIGS. 23 and 24. The method of manufacturing the semiconductor device according to this embodiment further includes, in the step of forming shared contact hole 34 reaching cobalt silicide film 13 on source/drain region 11 and cobalt silicide film 12 on gate electrode 312 at the same time in the method of manufacturing the semiconductor device according to the third embodiment described in conjunction with FIG. 22, the step of forming shared contact hole 35 formed by etching sidewall silicon nitride film 9. Then contact plugs 31a, 33a and 35a to connect with other conductive layers are formed to fill contact holes 31, 33 and shared contact hole 35, and the state as shown in FIG. 23 is attained.

Thus forming shared contact hole 35 provides a semiconductor device which can secure an increased contact area between contact plug 35a and gate electrode 312. Therefore, a semiconductor device with lower contact resistance between contact plug 35a and gate electrode 312 can be provided. As a result, the contact plug can be reduced in size and a semiconductor device even more reduced in size can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a silicon substrate having, on an upper surface of source/drain regions, a first refractory metal silicide film formed by a reaction with a refractory metal film deposited on a main surface;
   a gate electrode, having side surfaces and an upper surface, formed on said silicon substrate in a region between said source/drain regions and having, a silicon containing film and a second refractory metal silicide film formed by a reaction of the silicon containing film and a refractory metal film deposited on the silicon containing film;
   a first insulating film formed to cover the upper surface one of the side surfaces of said gate electrode;
   a second insulating film formed to cover the upper surfaces of said first insulating film and said first refractory metal silicide film and having an etching speed higher than said first insulating film in a prescribed etching condition;
   a first contact hole formed to reach a surface of one of said source/drain regions, a surface of the first insulating film being located on one of the side surfaces of the gate electrode and a surface of the first insulating film being located on the upper surface of the gate electrode through said second insulating film; and
   a shared contact hole formed through said first and second insulating films and reaching both of said gate electrode and the other one of said source/drain regions.

2. The semiconductor device according to claim 1, wherein said first refractory metal silicide film includes one of a cobalt silicide film and a titanium silicide film.

3. The semiconductor device according to claim 1, wherein said second refractory metal silicide film includes one of a cobalt silicide film and a titanium silicide film.

4. The semiconductor device according to claim 1, wherein said second insulating film includes a silicon oxide film.

5. The semiconductor device according to claim 1, further comprising a buffer film, having an expansion coefficient intermediate those of said first insulating film and said gate electrode, said buffer film positioned between said first insulating film and said gate electrode.

6. The semiconductor device according to claim 5, wherein
   said gate electrode includes a polycrystalline silicon film, said first insulating film includes a silicon nitride film, and said buffer film formed between said polycrystalline silicon film and said silicon nitride film includes a silicon oxide film.

7. The semiconductor device according to claim 5, wherein said first insulating film includes a silicon nitride film, and said buffer film formed between said second refractory metal silicide film and said silicon nitride film includes a silicon oxide film.

8. The semiconductor device according to claim 1, wherein said first and second insulating film in a region to form said shared contact hole are entirely removed.

9. The semiconductor device according to claim 1, further comprising:

a conductive layer covered with said first and second insulating films; and a second contact hole formed through said first and second insulating films and reaching said conductive layer.

* * * * *